(12) United States Patent
Bechthum et al.

(10) Patent No.: US 10,862,439 B2
(45) Date of Patent: Dec. 8, 2020

(54) SWITCHED-CAPACITOR POWER AMPLIFIERS

(71) Applicant: Stichting IMEC Nederland, Eindhoven (NL)

(72) Inventors: Elbert Bechthum, Veldhoven (NL); Ao Ba, Maarssen (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 70 days.

(21) Appl. No.: 16/222,340

(22) Filed: Dec. 17, 2018

(65) Prior Publication Data

US 2019/0190465 A1    Jun. 20, 2019

(30) Foreign Application Priority Data

Dec. 18, 2017   (EP) ..................................... 17208089

(51) Int. Cl.
*H03F 3/217*    (2006.01)
*H03F 3/00*     (2006.01)
(Continued)

(52) U.S. Cl.
CPC ........... *H03F 3/005* (2013.01); *H03F 1/0211* (2013.01); *H03F 3/193* (2013.01); *H03F 3/2171* (2013.01);
(Continued)

(58) Field of Classification Search
CPC ...... H03F 3/005; H03F 3/3028; H03F 3/2178; H03F 3/72; H03F 3/3064; H03F 3/193; H03F 1/0211; H03F 3/2171; H03F 2200/09; H03F 2200/421; H03F 2200/417; H03F 2200/48; H03F 2200/312; H03F 2200/451;
(Continued)

(56) References Cited

U.S. PATENT DOCUMENTS 8,547,177 B1    10/2013 Yoo et al.
9,136,762 B2 *   9/2015 Wang ............... H03K 17/04123
(Continued)

OTHER PUBLICATIONS

European Search Report, European Patent Application No. 17208089.7, dated Jun. 29, 2018, 12 pages.
(Continued)

*Primary Examiner* — Khanh V Nguyen
(74) *Attorney, Agent, or Firm* — McDonnell Boehnen Hulbert & Berghoff LLP

(57) ABSTRACT

A switched-capacitor power amplifier comprising a plurality of cells and methods for its operation are described. Switched signal lines switch supply to respective capacitors. Switches connect respective signal lines to a first supply and switches connect respective signal lines to a second supply. Pairs of switches on each signal line are switched so that one is switched off whilst the other is switched on. In a "full amplitude" mode, operation of the switches provides an output having a peak determined by the first supply. A switch signal line is provided between nodes in respective signal lines, a switch being provided in the switch signal line. In a "half amplitude" mode, switch is switched at the radio frequency in the other direction to that of switches connecting the signal lines to respective ones of the first and second supplies with the other switches being kept open.

8 Claims, 5 Drawing Sheets

(51) Int. Cl.
*H03F 1/02* (2006.01)
*H03F 3/193* (2006.01)
*H03F 3/30* (2006.01)
*H03F 3/72* (2006.01)

(52) U.S. Cl.
CPC ......... *H03F 3/2178* (2013.01); *H03F 3/3028* (2013.01); *H03F 3/3064* (2013.01); *H03F 3/72* (2013.01); *H03F 2200/09* (2013.01); *H03F 2200/312* (2013.01); *H03F 2200/417* (2013.01); *H03F 2200/421* (2013.01); *H03F 2200/451* (2013.01); *H03F 2200/48* (2013.01)

(58) Field of Classification Search
CPC .......... H03F 3/217; H03F 3/2173; H03F 2/72; H03F 1/0277
USPC ........................................ 330/51, 207 A, 251
See application file for complete search history.

(56) References Cited

U.S. PATENT DOCUMENTS 9,425,758 B2* 8/2016 Feygin ................... H03G 3/004
2011/0051842 A1* 3/2011 van der Heijden ..... H03F 3/217
　　　　　　　　　　　　　　　　　　　　　375/295
2014/0077876 A1 3/2014 Feygin et al.
2015/0155832 A1 6/2015 Onizuka et al.
2016/0336909 A1* 11/2016 Walling .................. H03F 3/217

OTHER PUBLICATIONS

Onizuka, Kohei et al., "A 1.8 GHz Linear CMOS Power Amplifier With Supply-Path Switching Scheme for WCDMA/LTE Applications", ISSCC 2013 / Session 5 / RF Techniques / 5.5, 2013 IEEE International Solid-State Circuits Conference, Feb. 18, 2013, pp. 90-91 and p. 5.

Wang, Hua et al., "The Wireless Workhorse", IEEE Microwave Magazine, Oct. 2015, pp. 36-63.

Yoo, Sang-Min et al., "A Class-G Switched-Capacitor RF Power Amplifier", IEEE Journal of Solid-State Circuits, vol. 48, No. 5, May 2013, pp. 1212-1224.

Yoo, Sang-Min et al., "A Class-G Dual-Supply Switched-Capacitor Power Amplifier in 65nm CMOS", 2012 IEEE Radio Frequency Integrated Circuits Symposium, 2012, pp. 233-236.

* cited by examiner

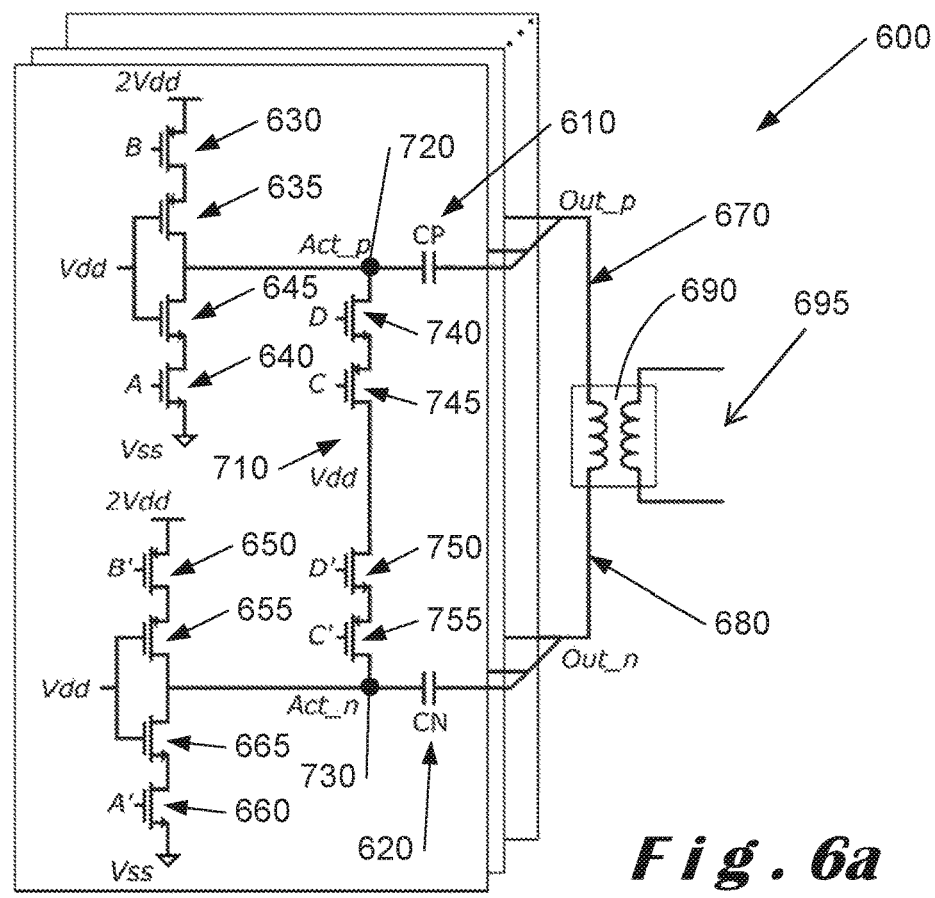
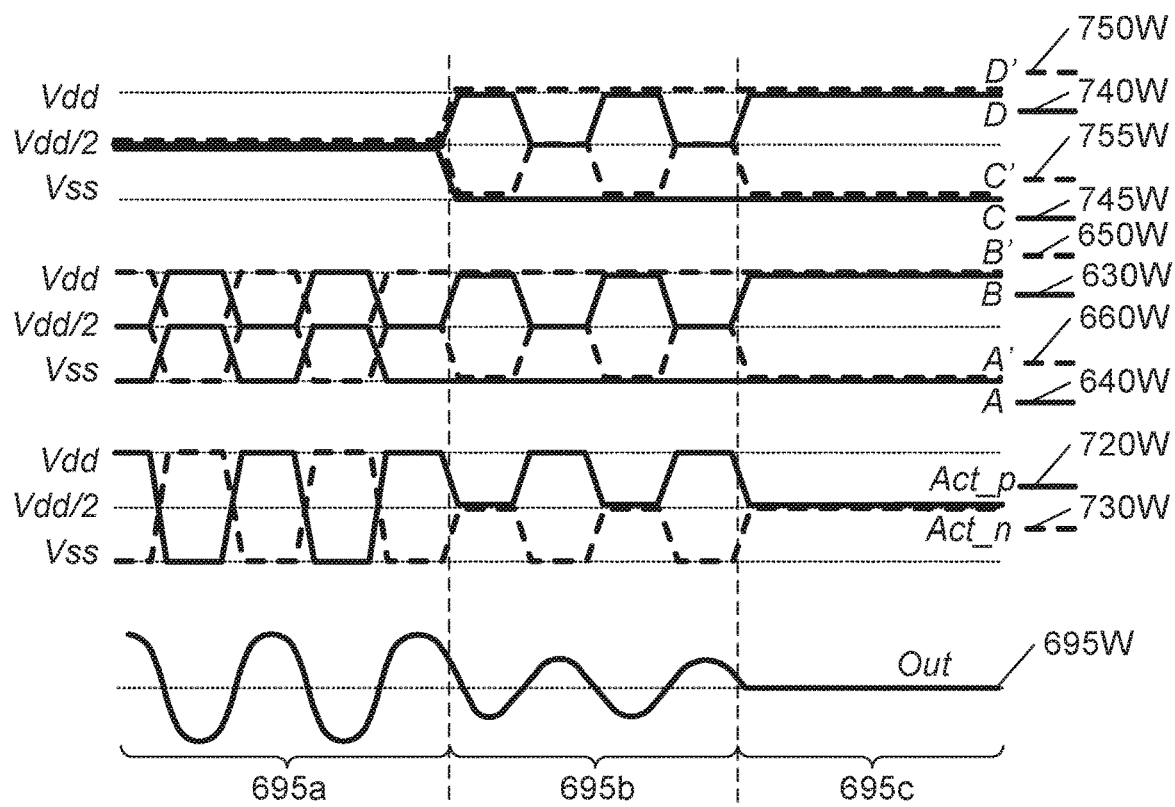
Fig. 6a
Fig. 6b

SWITCHED-CAPACITOR POWER AMPLIFIERS

CROSS-REFERENCE TO RELATED APPLICATIONS

The present application is a non-provisional patent application claiming priority to European Patent Application No. 17208089.7, filed on Dec. 18, 2017, the contents of which are hereby incorporated by reference.

FIELD OF THE DISCLOSURE

The present disclosure relates to switched-capacitor power amplifiers, and is more particularly concerned with systems and methods that can improve the efficiency of such amplifiers at back-off.

BACKGROUND

Power amplifiers can be important components of wireless transmitters. In switched-capacitor class D power amplifiers, for full output power, all cells generally switch an output capacitor between the supply voltage and the ground at the radio frequency (RF) frequency. Amplitude modulation can be performed by disabling some of the cells, and a disabled cell shorts the capacitor to either the supply voltage or ground. The efficiency of such power amplifiers is generally a function of the output amplitude. Whilst the efficiency at the peak output power is usually suitable, the efficiency typically degrades substantially at lower output amplitudes. This degraded efficiency is caused by the off-cells which attenuate the output signal and consume a part of its power.

When a switched-capacitor power amplifier operates at back-off, for example, at around 30% output amplitude (back-off being at any percentage between 0% and 100%), the efficiency is degraded with respect to the peak output power, and when the output signal has a peak-to-average-power-ratio, the average efficiency is degraded with respect to the peak efficiency. Back-off is the output of a power amplifier when the output is not at its maximum value, but at a value lower than its maximum value. Hence, the output power is reduced with respect to the maximum output power. For signals with a non-constant amplitude, e.g., with a large peak-to-average power ratio (PAPR), the power amplifier operates continuously in back-off. This means that, for these signals, the efficiency is also reduced with respect to the efficiency at maximum output power.

There are existing approaches for improving the efficiency at back-off. In one approach, the supply voltage can be used to modulate efficiently the switched-capacitor power amplifier (SCPA) output amplitude. However, the resulting amplitude range is limited. When the threshold voltage of the transistors is reached, the efficiency drops rapidly. Furthermore, this method has a very non-linear transfer from the supply voltage to output amplitude. In another approach, the use of two power supplies is proposed for improving efficiency at back-off (as described in "A Class-G Switched-Capacitor RF Power Amplifier" by S. M. Yoo et al., IEEE Journal of Solid-State Circuits, Vol. 48, No. 5, pages 1212 to 1224, May 2013). However, such an approach has increased overheads due to the provision of the second power supply and its associated connections.

In another approach, a Doherty amplifier has an improved efficiency at back-off by adding the outputs of two amplifiers, one for the normal range and one for the peak output amplitude values. However, such amplifiers tend to work only with small frequency ranges and require significant design effort.

In a further approach, the power amplifiers are stacked for efficiency enhancement at back-off (as described in "A 1.8 GHz linear CMOS power amplifier with supply-path switching scheme for WCDMA/LTE applications" by K. Onizuka et al., IEEE International Solid-State Circuits Conference Digest of Technical Papers, San Francisco, Calif., 2013, pages 90 to 91). The circuit consists of two power amplifiers arranged in parallel so that their output power is added. For peak output amplitude, both power amplifiers are supplied by the full supply voltage. When the required output amplitude is half of the peak output amplitude, one power amplifier is supplied by maximum supply and half the maximum supply, and, the other power amplifier is supplied with half the maximum supply and ground. In this way, each power amplifier receives half the supply voltage and produces half the output amplitude while maintaining high efficiency.

An implementation of such an amplifier is described in US-A-2015/0155832 where a power amplifier comprises first and second amplifier units which are connected to separate power supplies and which connected together to form an intermediate node. A first switching element is provided between a ground terminal of the first amplifier and a power supply terminal of the second amplifier, a second switching element is provided between a ground terminal of the first amplifier and a first reference voltage terminal, and, a third switching element is provided between the power supply terminal of the second amplifier and a second reference voltage terminal. Control logic is used to operate the switches in the connections between the first and second amplifier units and their respective power supply terminals.

Whilst improved efficiency at back-off may be obtained using such an amplifier arrangement, this amplifier arrangement requires a "voltage holding circuit" as well as complex circuitry to implement amplitude modulation with sufficient resolution.

SUMMARY

Embodiments of this disclosure involve a switching scheme for switched-capacitor power amplifiers which can improve the efficiency at back-off without loss of peak output power and while only using one power supply voltage.

In some embodiments, there is provided a cell for a switched-capacitor power amplifier comprising: first and second differential capacitors configured for providing a differential full amplitude output signal therefrom; first and second input signal lines configured to be connected to respective ones of the first differential capacitors; first and second switches provided in the first input signal line, the first switch being configured for supplying a first voltage supply to the first input signal line and the second switch being configured for supplying a second voltage supply to the first input signal line, the first and second switches being switched at a predetermined radio frequency; third and fourth switches provided in the second input signal line, the third switch being configured for supplying the first voltage supply to the second input signal line and the fourth switch being configured for supplying the second voltage supply to the second input signal line, the third and fourth switches being switched at the predetermined radio frequency with the first and fourth switches being switched together and the second and third switches being switched together; and a switched signal line between the first and second signal lines, the switched signal line including a further switch which is configured to be switched at the predetermined radio frequency in accordance with the first and fourth switches, the switched signal line providing a differential half amplitude output signal.

By providing a "half amplitude" mode as well as a "full amplitude" mode in each cell, it is possible to generate an output amplitude that is lower than the maximum output amplitude, without configuring some of the PA cells in the "off" mode and thereby losing efficiency. Moreover, due to the use of the "half amplitude" mode, the efficiency at back-off can remain approximately equal to the efficiency at maximum output amplitude, thereby providing efficiency enhancement at each level of output-power back-off, with the efficiency enhancement not being limited to specific output-power back-off values.

In an embodiment, the further switch comprises first and second further switch elements, the first and second further switch elements being configured to be switched together.

In another embodiment, the first switch comprises first and second switch elements and second switch comprises third and fourth switch elements, the second switch element and the third switch element being connected to one another and to a third supply voltage, the third supply voltage being lower than the first supply voltage but greater than the second supply voltage.

In embodiments, the third switch comprises fifth and sixth switch elements and the fourth switch comprises seventh and eighth switch elements, the sixth switch element and the seventh switch element being connected to one another and to the third supply voltage, the third supply voltage being lower than the first supply voltage but greater than the second supply voltage.

In a further embodiment, the further switch comprises four switch elements configured as two pairs of switches, and the switch signal line defines a central node at the third voltage.

In one embodiment, the second voltage is ground.

In accordance with another aspect of the present disclosure, there is provided a switched-capacitor power amplifier comprising a plurality of cells as described above, wherein the differential output signal from each cell is connected together to form a combined differential output signal.

In accordance with a further aspect of the present disclosure, there is provided a method of operating a cell for a switched-capacitor power amplifier, the method comprising the acts of: connecting first and second differential capacitors in respective first and second input signal lines, the first and second differential capacitors being configured for providing a differential full amplitude output signal therefrom; connecting first and second switches in the first signal line; supplying first and second voltage supplies to the first input signal line by way of respective ones of the first and second switches; switching the first and second switches at a predetermined radio frequency; connecting third and fourth switches in the second input signal line; supplying the first and second voltage supplies to the second input signal line by way of respective ones of the third and fourth switches; switching the third and fourth switches at the predetermined radio frequency, the first and fourth switches being switched together and the second and third switches being switched together; connecting a further switch between the first and second signal lines; and switching the further switch at the predetermined radio frequency in accordance with the first and fourth switches to provide a differential half amplitude output signal, the second and third switches being in an open condition.

In accordance with a yet further aspect of the present disclosure, there is provided a method of operating a switched-capacitor power amplifier, the method comprising performing for each cell, the method as described above.

BRIEF DESCRIPTION OF THE FIGURES

The above, as well as additional, features will be better understood through the following illustrative and non-limiting detailed description of example embodiments, with reference to the appended drawings.

FIG. 6a is a schematic view of a switched-capacitor power amplifier where the supply is between a maximum safe transistor voltage and twice the maximum safe transistor voltage, according to an embodiment.

FIG. 6b illustrates waveforms for the amplifier shown in FIG. 6a, according to an embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
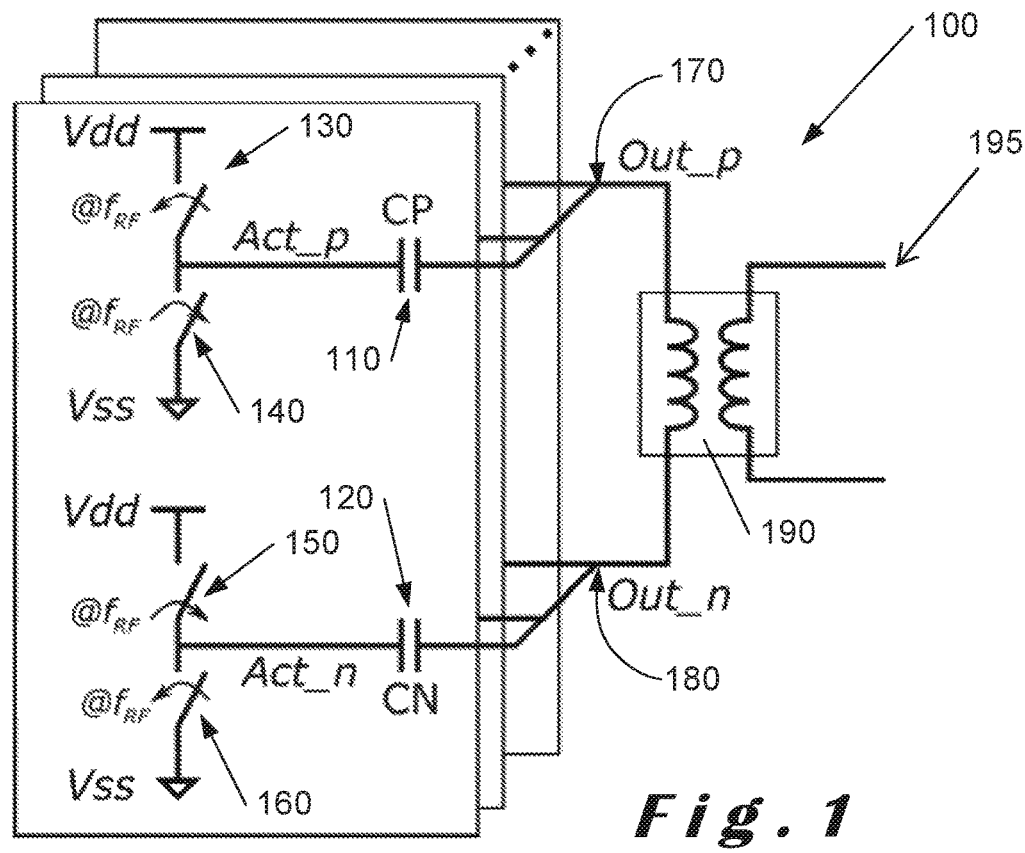
FIG. 1 is a schematic view of a switched-capacitor class-D power amplifier, according to an embodiment.

FIG. 1 illustrates a switched-capacitor power amplifier (SCPA) 100 comprising a plurality of cells, each cell comprising differential capacitors, namely, first and second capacitors 110, 120. The first capacitor 110 is connected, in a first signal line, to switches 130, 140 which, in turn, are connected to a supply voltage, $V_{dd}$, and to ground, $V_{ss}$, respectively. Switches 130, 140 are switched at an applied radio frequency (RF). The second capacitor 120 is connected, in a second signal line, to switches 150, 160 which are connected to a supply voltage, $V_{dd}$, and to ground, $V_{ss}$, respectively. Switches 150, 160 are also switched at the same applied RF. In operation, switches 130 and 160 are configured to close as switches 140 and 150 open as shown. Differential outputs 170, 180 from the first and second capacitors 110, 120 of each cell are combined at 190 and connect to a load 195. Although only one cell is shown, it will readily be appreciated that similar, if not identical, arrangements are provided in the other cells.

Although $V_{ss}$ is described as being ground, this can be any other suitable voltage which is lower than the supply voltage $V_{dd}$.

For full power output, all cells switch the first and second output capacitors 110, 120 between the supply voltage, $V_{dd}$, and the ground, $V_{ss}$, at RF. Amplitude modulation is performed by disabling some of the cells by shorting the capacitors to either $V_{dd}$ or $V_{ss}$.

Figure 2:
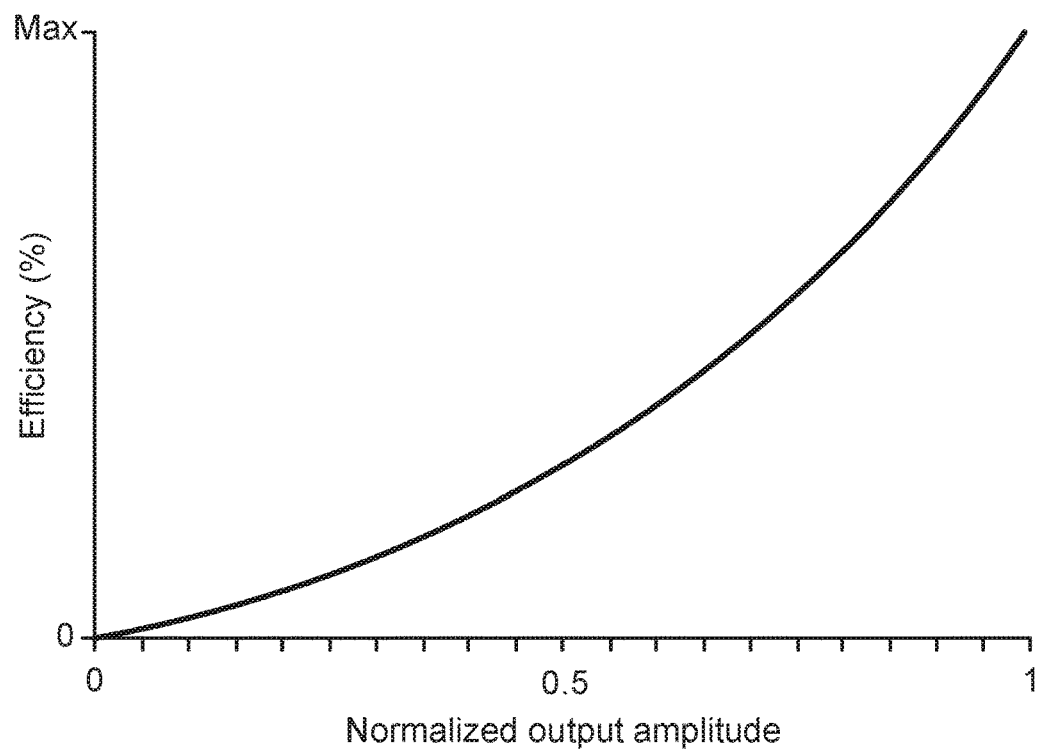
FIG. 2 is a graph illustrating typical efficiency of the power amplifier of FIG. 1, according to an embodiment.

As described above, the efficiency of an SCPA is typically a function of its output amplitude. A typical efficiency curve as a function of normalized output amplitude is shown in FIG. 2. As shown, the efficiency at peak output amplitude is good but falls off as output amplitude decreases.

Some embodiments include a switching scheme for an SCPA which helps address the issue of reduced efficiency at back-off, that is, at reduced output amplitude. In contrast to conventional SCPAs, embodiments herein can provide an SCPA with not only a "full amplitude" mode and an "off" mode, but a "half amplitude" mode. Cells can be changed to "half amplitude" when a lower output amplitude is desired, and when an even lower output amplitude is desired, some of the cells can be switched to the "off" mode.

Figure 3A:
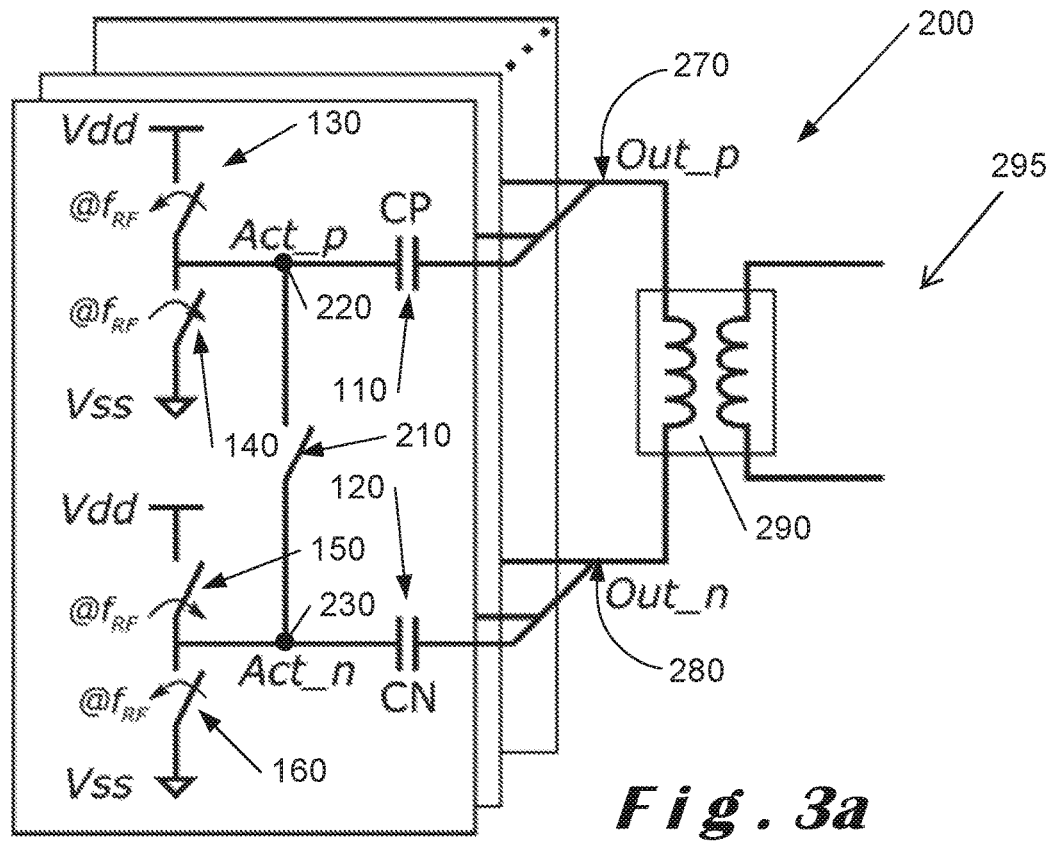
FIG. 3a is a schematic view of a switched-capacitor power amplifier at "full output amplitude," according to an embodiment.
Figure 3B:
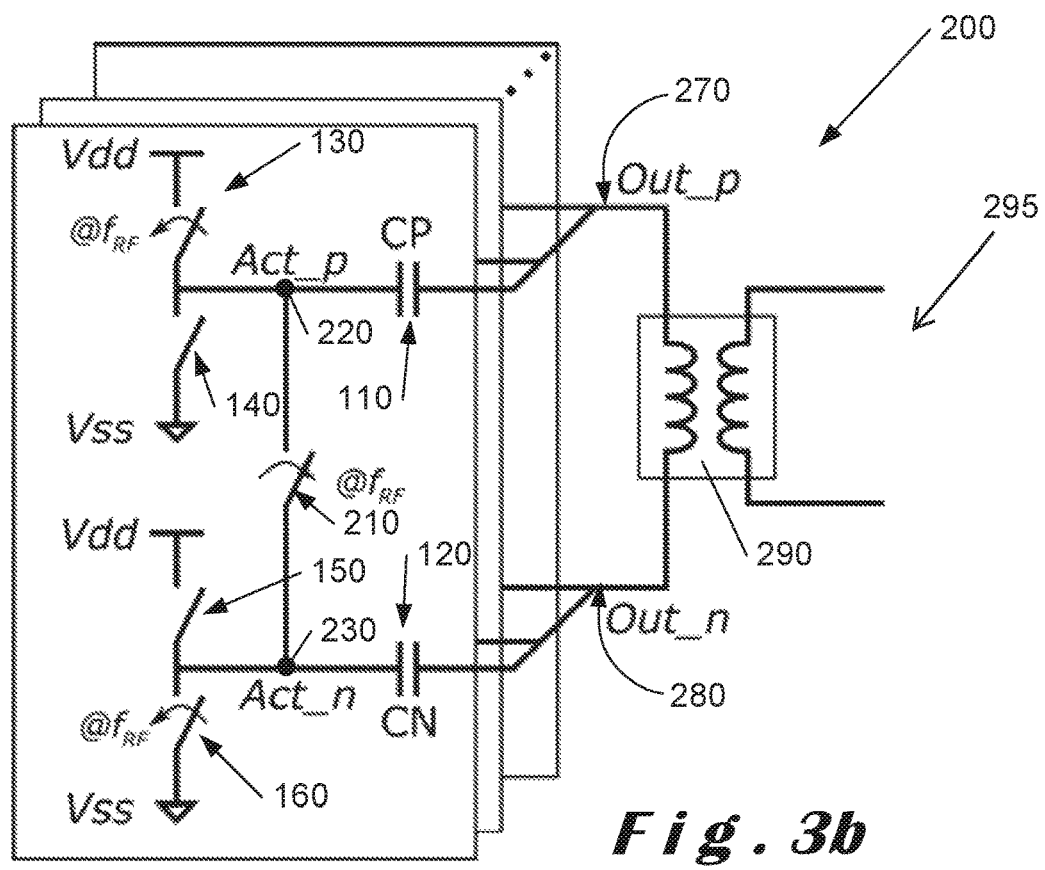
FIG. 3b is a schematic view of a switched-capacitor power amplifier at "half output amplitude," according to an embodiment.

FIGS. 3a and 3b illustrate a switching scheme for an SCPA in accordance with embodiments. Components previously described with reference to FIG. 1 bear the same reference numerals.

In FIG. 3a, SCPA 200 is shown, which is similar to SCPA 100 of FIG. 1 but with an additional switch 210, in a switch signal line, connecting capacitors 110, 120 together at nodes 220, 230 as shown. As described above with reference to FIG. 1, the switches 130, 140, 150, 160 operate at RF for the "full amplitude" mode.

FIG. 3b illustrates the switch 210 also being switched at RF with switches 140, 150 being open with no connection to $V_{ss}$ and $V_{dd}$ respectively. FIG. 3b also shows switches 130, 160 switching at RF. Output 270 from capacitor 110 and output 280 from capacitor 120 are combined at 290 and connect to load node 295.

In this way, the two differential capacitors 110, 120 are switched between the supply voltage, $V_{dd}$, ground, $V_{ss}$, and being connected together by switch 210. Effectively, the signal swing at the capacitor is half of the "full amplitude" mode. When none of the cells are in the "off" mode, no power is lost and hence efficiency is preserved down to half of the peak output amplitude.

In "full amplitude" mode (as shown in FIG. 3a), node 220 switches between the supply voltage, $V_{dd}$, and ground, $V_{ss}$. Signals applied to node 230 are the inverse or complement to those applied to node 220. If all cells are in this mode, the output power, $P_{out}$, is:

$$P_{out} = \frac{2}{\pi^2} \cdot \frac{V_{dd}^2}{R_{load}}$$

where $R_{load}$ is the load impedance at the load node 295 assuming $V_{ss}$=0.

When all cells are in the "half amplitude" mode (as shown in FIG. 3b), node 220 switches between the supply voltage, $V_{dd}$, and half the supply voltage as switch 140 is open. Similarly, signals applied to node 230 are the inverse or complement of those applied to node 220, switching between ground, $V_{ss}$, and half the supply voltage, $V_{dd}$. The output power is:

$$P_{out} = \frac{2}{\pi^2} \cdot \frac{\left(\frac{1}{2}V_{dd}\right)^2}{R_{load}}$$

In general, the output power of the SCPA in accordance with the present disclosure is:

$$P_{out} = \frac{2}{\pi^2} \left(\frac{n_f + \frac{n_h}{2}}{N}\right)^2 \cdot \frac{V_{dd}^2}{R_{load}}$$

where $n_f$ is the number of cells in the "full amplitude" mode, $n_h$ is the number of cells in the "half amplitude" mode, and N is the total number of cells.

The sum of $n_f$ and $n_h$ should be less than or equal to N. This assumes that all cells have equal weight (unary scaling). However, this is not necessarily the case. Binary scaling or a combination of unary and binary scaling is also possible (segmented).

Figure 4A:
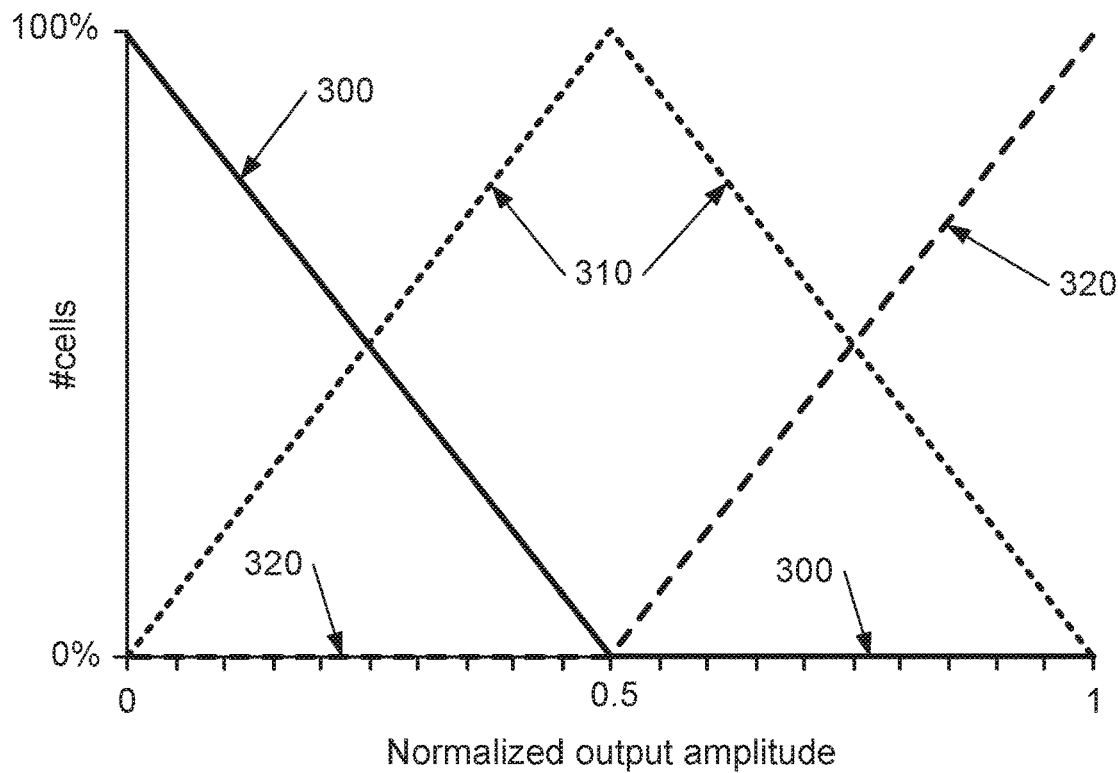
FIG. 4a is a graph illustrating a comparison of a number of cells in the "full amplitude" mode, the "half amplitude" mode, and an "off" mode, according to an embodiment.
Figure 4B:
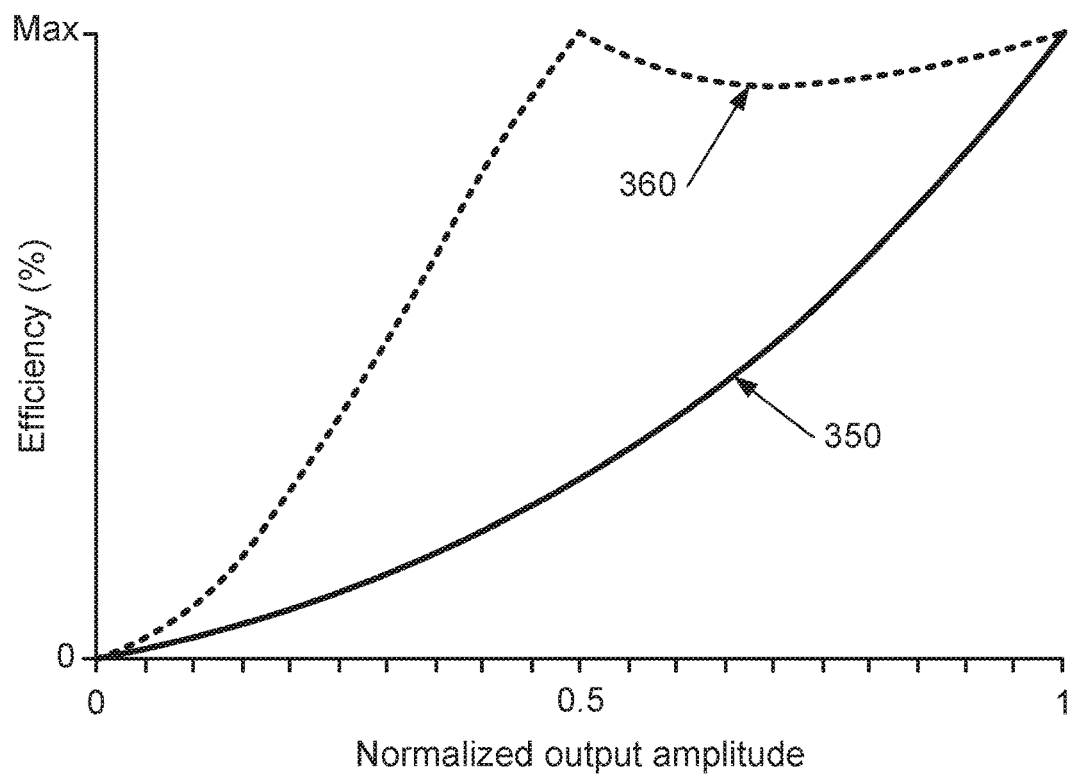
FIG. 4b is a graph illustrating a comparison of efficiency for two switched-capacitor power amplifiers, according to an embodiment.

For increased efficiency, a specific sequence of enabling the different modes is typically required. However, other sequences may be used for enabling the different modes. The number of "full amplitude," "half amplitude," and "off" cells is dependent on the output amplitude as shown in FIG. 4a. Line 300 refers to the "off" cells; line 310 refers to the "half amplitude" cells; and line 320 refers to the "full amplitude" cells. The resulting efficiency curve is shown in FIG. 4b where line 350 refers to the efficiency of a conventional SCPA as shown in FIG. 2, and line 360 refers to the efficiency of an SCPA in accordance with the present disclosure. As shown, the efficiency of the SCPA in accordance with the present disclosure can perform better at lower normalized output amplitudes than conventional SCPA, for example, as shown in FIG. 1.

Figure 5A:
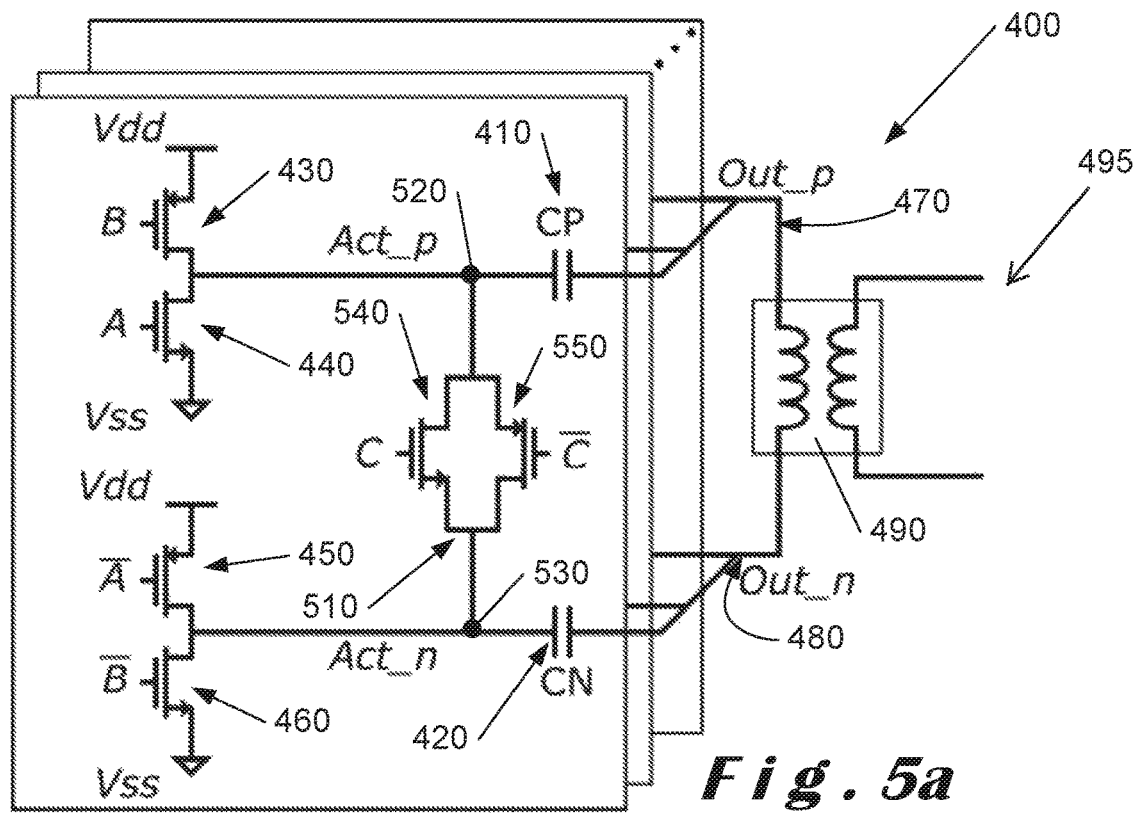
FIG. 5a is a schematic view of a switched-capacitor power amplifier where the supply is less than the maximum safe transistor voltage, according to an embodiment.

The switching scheme of the present disclosure can be implemented in at least two ways using transistors as shown in FIGS. 5a and 5b and FIGS. 6a and 6b and as described in more detail below. When using a power supply voltage $V_{dd}$ lower than the maximum safe transistor voltage $V_{max}$, the embodiment shown in FIG. 5a is typically used, and when using a power supply voltage $V_{dd}$ higher than the maximum safe transistor voltage $V_{max}$ but lower than twice the maximum safe transistor voltage $V_{max}$, the embodiment of FIG. 6a is typically used.

Referring initially to FIG. 5a, an SCPA 400 in accordance with the present disclosure is shown where the switches of FIGS. 3a and 3b are implemented by transistors. The SCPA 400 comprises first and second capacitors 410, 420 where the first capacitor 410 is connected to transistors 430, 440, in a first signal line, which in turn are connected to a supply voltage $V_{dd}$ and to ground $V_{ss}$ respectively. Transistors 430, 440 are switched at an applied RF. The second capacitor 420 is connected to transistors 450, 460, in a second signal line, which in turn are connected to a supply voltage $V_{dd}$ and to ground $V_{ss}$ respectively. Transistors 450, 460 are also switched at the applied RF.

Input signals to transistors 430 and 460 are such that transistor 430 receives signal B and transistor 460 receives signal $\overline{B}$. Similarly, input signals to transistors 440 and 450 are such that transistor 440 receives signal A and transistor 450 receives signal $\overline{A}$.

Differential outputs 470, 480 from the first and second capacitors 410, 420 are combined at 490 and connected to a load node 495. Input signals to transistors 450 and 460 are effectively inverted signals of input signals to transistors 440 and 430 respectively.

An additional transistor arrangement 510 is shown, in a switch signal line, connecting capacitors 410, 420 together at nodes 520, 530. The transistor arrangement 510 comprises first and second transistors 540, 550 where input signals to transistors 550, 540 are such that transistor 540 receives input signal C and transistor 550 receives signal $\overline{C}$.

In a non-illustrated embodiment, only one of the first and second transistors 540, 550 is present to implement the switch 510.

As before, although only one cell is shown, it will readily be appreciated that similar if not identical arrangements are provided in the other cells, and that the output from each cell is connected to form differential outputs 470 and 480 respectively.

In the "full amplitude" mode, transistors 430, 440, 450, and 460 are switched at the RF frequency, thereby generating a square wave with an amplitude of $V_{dd}$ at node 520 and at node 530 (assuming $V_{ss}=0$).

In the "half amplitude" mode, transistors 430, 460, 540, 550 are switched at the RF frequency, thereby generating a square wave with an amplitude of $0.5*V_{dd}$ at nodes 520 and 530. Hence, the output amplitude of the "half amplitude" mode is half of the "full amplitude" mode.

In the "off" mode, transistors 440, 450, 540 and 550 are off, and, transistors 430 and 460 tie nodes 520 and 530 at $V_{dd}$ and $V_{ss}$ respectively. Other options for the "off" mode are possible, where the nodes 520 and 530 are connected to either one of $V_{dd}$ or $V_{ss}$ or connected together.

Figure 5B:
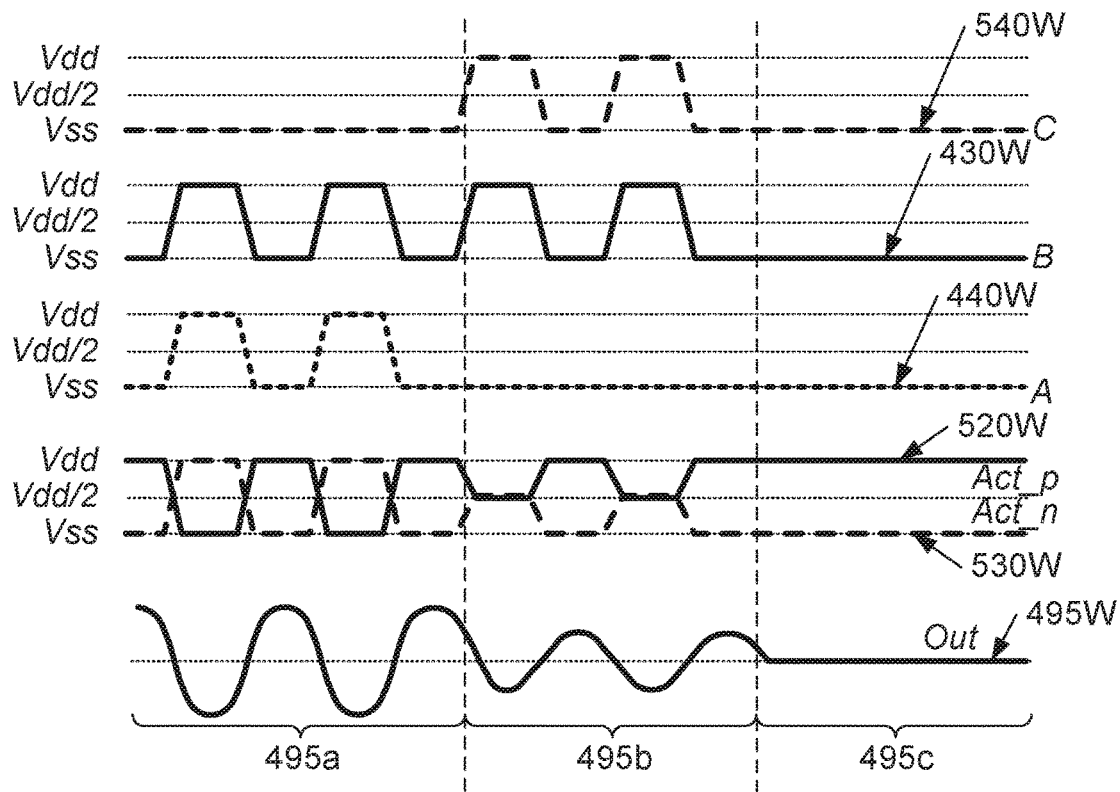
FIG. 5b illustrates waveforms for the amplifier shown in FIG. 5a, according to an embodiment.

FIG. 5b shows waveforms A, B, and C at inputs to transistors 440, 430, 540, at nodes 520, 530 (Act_p, Act_n) and at load node 495 (Out) for all three modes. Waveforms 440W, 430W, 540W, 520W, 530W and 495W correspond to respective inputs to the transistors 440, 430, 540, at the nodes 520, 530, and at load node 495 for all three modes. Sections 495a, 495b, and 495c of the waveform 495W correspond respectively to "full amplitude" mode, "half amplitude" mode, and "off" mode. It will readily be understood that as the input signals to transistors 450, 460, and 550 are inverted with respect to those input to transistors 440, 430, and 540 respectively.

Turning now to FIG. 6a, an SCPA 600 used when using a power supply voltage $V_{dd}$ higher than the maximum transistor voltage $V_{max}$ but lower than twice the maximum transistor voltage $2V_{max}$ is shown. Each cell comprises first and second capacitors 610, 620 connected to respective outputs 670 and 680 which are combined at 690 to provide an output load node 695. As before, the first capacitor 610 is in a first signal line and the second capacitor 620 is in a second signal line.

In this embodiment, there are two supply voltages, namely, twice the supply voltage, $2V_{dd}$ and ground $V_{ss}$. Transistors 630 and 650 are connected to the higher supply voltage $2V_{dd}$, and transistors 640 and 660 are connected to ground $V_{ss}$. The bias voltage $V_{dd}$ is connected to transistors 635, 645, 655, 665 as shown. Transistor 640 receives input signal A and transistor 660 receives input signal A', with transistor 630 receiving input signal B and transistor 650 input signal B'.

Nodes 720, 730 are connected together by transistor arrangement 710 in a switch signal line. In this embodiment, transistor arrangement 710 comprises transistors 740, 745, 750, and 755 as shown, where the input signal to transistor 740 is D with input signal to transistor 750 being D' and input signal to transistor 745 is C with input signal to transistor 755 being C'. In this embodiment, $V_{dd}$ exists between transistors 745 and 750 as shown, and it does not need to be supplied externally with a voltage supply or a stabilizing circuit. However, this embodiment does not exclude the use of a voltage supply or stabilizing circuit. Although the voltage $V_{dd}$ is the same as the gate for transistors 635, 645, 655, 665, in essence, the gate side and switching side do not need to be connected, although they could be.

In the "full amplitude" mode, transistors 640, 630, 650, and 660 are switched at the applied RF, thereby generating a square wave with an amplitude of $2V_{dd}$ at nodes 720 and 730. Transistors 745, 740, 755, and 750 are controlled such that the connection between nodes 720 and 730 is open.

In the "half amplitude" mode, transistors 630, 740, 755, and 660 are switched at the RF frequency, thereby generating a square wave with an amplitude of $0.5*2V_{dd}$ at nodes 720, 730. Hence, the output amplitude of the "half amplitude" mode is half of the amplitude of the "full amplitude" mode.

In the "off" mode, transistors 745, 740, 755, and 750 are configured such that nodes 720, 730 are statically connected together. Other options for the "off" mode are possible, where the nodes 720 and 730 are connected to either $V_{ss}$ or $V_{dd}$.

The corresponding waveforms 640W (A), 660W (A'), 630W (B), 650W (B'), 745W (C), 755W (C'), 740W (D), and 750W (D') of input signals to respective transistors 640, 660, 630, 650, 745, 755, 740, 750 and the waveforms at nodes 720, 730 (Act_p, Act_n) and at load node 795 (Out) are shown in FIG. 6b, for all three modes. Sections 695a, 695b and 695c respectively illustrate the "full amplitude", "half amplitude" and "off" modes.

Potential advantages of the method in accordance with the present disclosure include: power amplifier efficiency improvement in back-off;

power amplifier efficiency improvement for signals with high PAPR;

efficiency improvement independent of frequency or bandwidth; and no additional power supplies being required to generate the "half amplitude" mode.

Although specific implementations for switching the cells of the SCPA are discussed in accordance with the present disclosure, it will readily be appreciated that other implementations for achieving a similar switching regime may be possible.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A switched-capacitor power amplifier cell comprising:
a first capacitor and a second capacitor;
a first input signal line connected to the first capacitor and a second input signal line connected to the second capacitor;
a first switch and a second switch both connected to the first input signal line, the first switch being configured for supplying a first supply voltage to the first input signal line and the second switch being configured for supplying a second supply voltage to the first input signal line;
a third switch and a fourth switch both connected to the second input signal line, the third switch being configured for supplying the first supply voltage to the second input signal line and the fourth switch being configured for supplying the second supply voltage to the second input signal line; and
a switched signal line connecting the first input signal line and the second input signal line, the switched signal line comprising a fifth switch, wherein
in a first mode of the switched-capacitor power amplifier cell, the first switch and the second switch are configured to switch at a common frequency and out of phase with one another, the third switch and the fourth switch are configured to switch at the common frequency and out of phase with one another, the first switch and the fourth switch are configured to switch in phase with one another, the second switch and the third switch are configured to switch in phase with one another, and the fifth switch is in an open condition, and
in a second mode the first switch and the fourth switch are configured to switch in phase with one another, the second switch and the third switch are in an open condition, and the fifth switch is configured to switch out of phase with the first switch and the fourth switch.

2. The switched-capacitor power amplifier cell according to claim 1, wherein the fifth switch comprises a first switch element and a second switch element, the first switch element and the second switch element being configured to be switched in phase with one another.

3. The switched-capacitor power amplifier cell according to claim 1, wherein the first switch comprises a first switch element and a second switch element and the second switch comprises a third switch element and a fourth switch element, the second switch element and the third switch element being connected to one another and to a third supply voltage, the third supply voltage being less than the first supply voltage but greater than the second supply voltage.

4. The switched-capacitor power amplifier cell according to claim 3, wherein the third switch comprises a fifth switch element and a sixth switch element and the fourth switch comprises a seventh switch element and an eighth switch element, the sixth switch element and the seventh switch element being connected to one another and to the third supply voltage.

5. The switched-capacitor power amplifier cell according to claim 4, wherein the fifth switch comprises:
a ninth switch element connected to the first input signal line;
a tenth switch element connected to the ninth switch element and connected to a central node that is held at the third supply voltage;
an eleventh switch element connected to the central node; and
a twelfth switch element connected to the eleventh switch element and the second input signal line.

6. The switched-capacitor power amplifier cell according to claim 1, wherein the second supply voltage is equal to ground.

7. A switched-capacitor power amplifier comprising a plurality of switched-capacitor power amplifier cells according to claim 1, wherein the switched-capacitor power amplifier is configured such that a differential output signal from each cell of the plurality of switched-capacitor power amplifier cells is connected together to form a combined output.

8. A method of operating a switched-capacitor power amplifier cell, the method comprising:
switching a first switch and a second switch at a common frequency and in phase with each other, the first switch being configured for supplying a first supply voltage to a first input signal line and the second switch being configured for supplying a second supply voltage to a second input signal line, the first input signal line comprising a first capacitor and the second input signal line comprising a second capacitor; and
switching a third switch at the common frequency out of phase with the first switch and the second switch, the third switch being configured to connect the first input signal line to the second input signal line.

* * * * *